United States Patent
De Rauw

(10) Patent No.: US 12,391,034 B2
(45) Date of Patent: Aug. 19, 2025

(54) METHOD AND SYSTEM FOR APPLYING A PATTERN ON A MASK LAYER

(71) Applicant: XSYS Prepress N.V., Ypres (BE)

(72) Inventor: Dirk Ludo Julien De Rauw, Ninove (BE)

(73) Assignee: XSYS PREPRESS N.V., Ypres (BE)

( * ) Notice: Subject to any disclaimer, the term of this patent is extended or adjusted under 35 U.S.C. 154(b) by 71 days.

(21) Appl. No.: 17/439,919

(22) PCT Filed: Mar. 19, 2020

(86) PCT No.: PCT/EP2020/057645
§ 371 (c)(1),
(2) Date: Sep. 16, 2021

(87) PCT Pub. No.: WO2020/188041
PCT Pub. Date: Sep. 24, 2020

(65) Prior Publication Data
US 2022/0176688 A1  Jun. 9, 2022

(30) Foreign Application Priority Data

Mar. 20, 2019 (NL) ..................................... 2022776

(51) Int. Cl.
*B41C 1/00* (2006.01)
*B41F 3/28* (2006.01)
(Continued)

(52) U.S. Cl.
CPC ................ *B41C 1/003* (2013.01); *B41F 3/28* (2013.01); *G03F 1/20* (2013.01); *G06F 9/30018* (2013.01)

(58) Field of Classification Search
CPC ........ B41C 1/003; G06F 9/30018; B41F 3/28; G03F 1/20
See application file for complete search history.

(56) References Cited

U.S. PATENT DOCUMENTS

2004/0177782 A1   9/2004  McCrea et al.
2005/0226498 A1*  10/2005  Lee .................. H04N 1/405
                                                    382/162
(Continued)

FOREIGN PATENT DOCUMENTS

EP   0734147 A1   9/1996
EP   1401190 A2   3/2004
(Continued)

OTHER PUBLICATIONS

International Search Report and Written Opinion for the International Patent Application No. PCT/EP2020/057645, mailed Jun. 26, 2020, 15 pages.

(Continued)

*Primary Examiner* — Stephen D Meier
*Assistant Examiner* — Quang X Nguyen
(74) *Attorney, Agent, or Firm* — KDW Firm PLLC

(57) ABSTRACT

A method for applying a pattern on a mask layer includes obtaining an image file representing pixels with a first pixel size in a first direction parallel to an edge of the pixel, and a second pixel size in a second direction perpendicular to the first direction, where the first and second pixel size are the same or different, treating the mask layer such that a plurality of areas with altered physical properties are created in the mask layer, the plurality of areas corresponding to a plurality of pixels of the image file, where the treatment is done such that a first and/or a second area size of an area of said plurality of areas, seen in said first and/or said second direction, is smaller than the first and/or second pixel size, respectively.

24 Claims, 8 Drawing Sheets

(51) Int. Cl.
      *G03F 1/20*       (2012.01)
      *G06F 9/30*       (2018.01)

(56)           References Cited

U.S. PATENT DOCUMENTS

2017/0131636 A1*   5/2017   Vest ...................... G03F 7/2022
2019/0315141 A1*  10/2019   Morisse ................. G03F 7/202

FOREIGN PATENT DOCUMENTS

| | | | | | |
|---|---|---|---|---|---|
| JP | 2001010192 | A | * | 1/2001 | ............. B41L 13/06 |
| JP | 2006100964 | A | | 4/2006 | |
| JP | 2010137525 | A | * | 6/2010 | |
| JP | 2016118652 | A | | 6/2016 | |
| WO | 2017203034 | A1 | | 11/2017 | |

OTHER PUBLICATIONS

International Preliminary Report on Patentability for the International Patent Application No. PCT/EP2020/057645, mailed Mar. 11, 2021, 12 pages.

* cited by examiner

Fig. 4A (Reference # 1 - Prior Art)
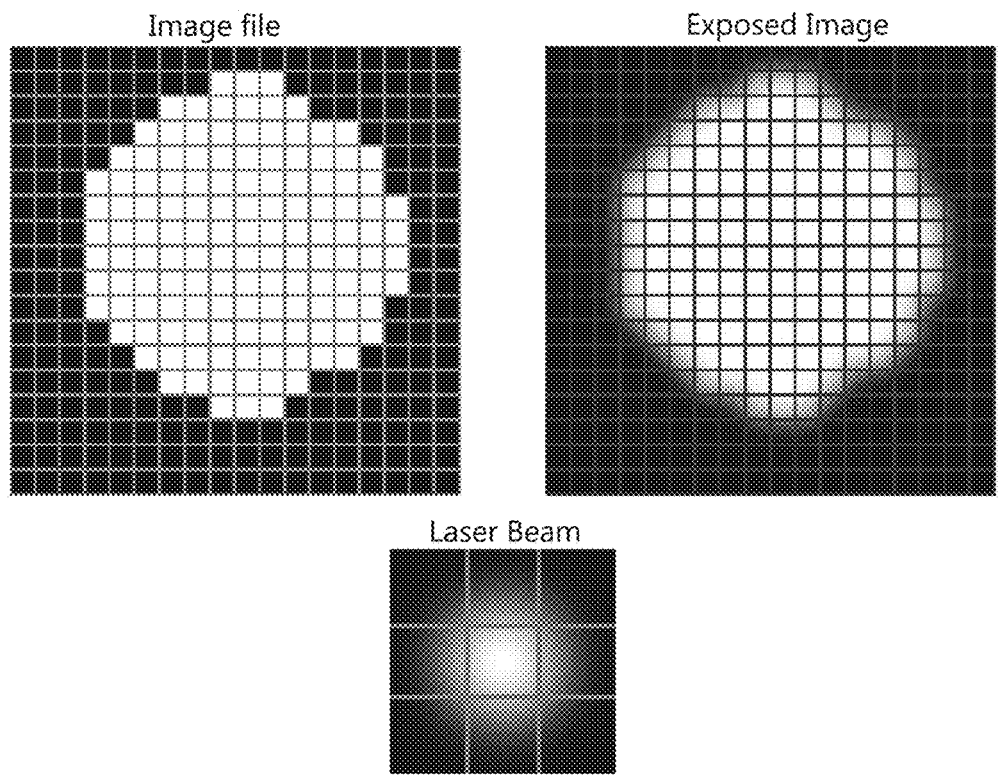
Fig. 4B (Reference # 2 - Prior Art)
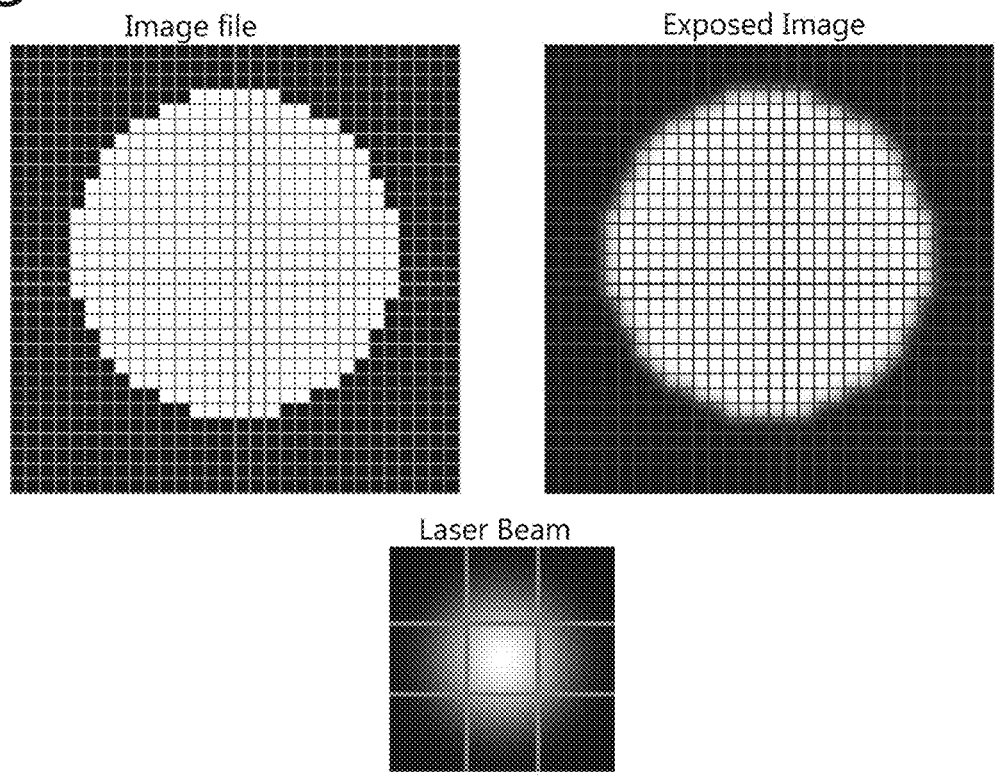

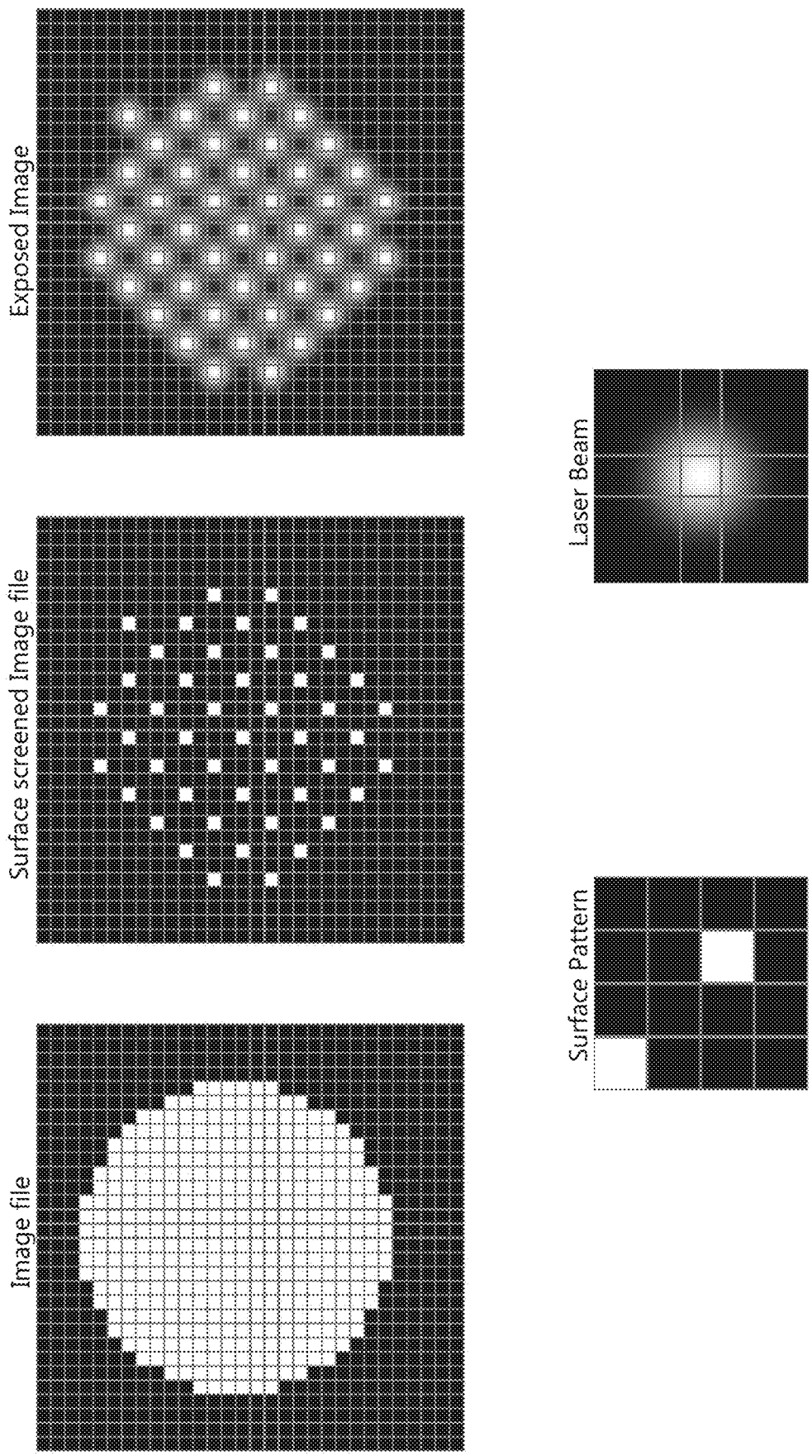
Fig. 4C (Reference #3 - Prior Art)

Fig. 5A (Example #1)
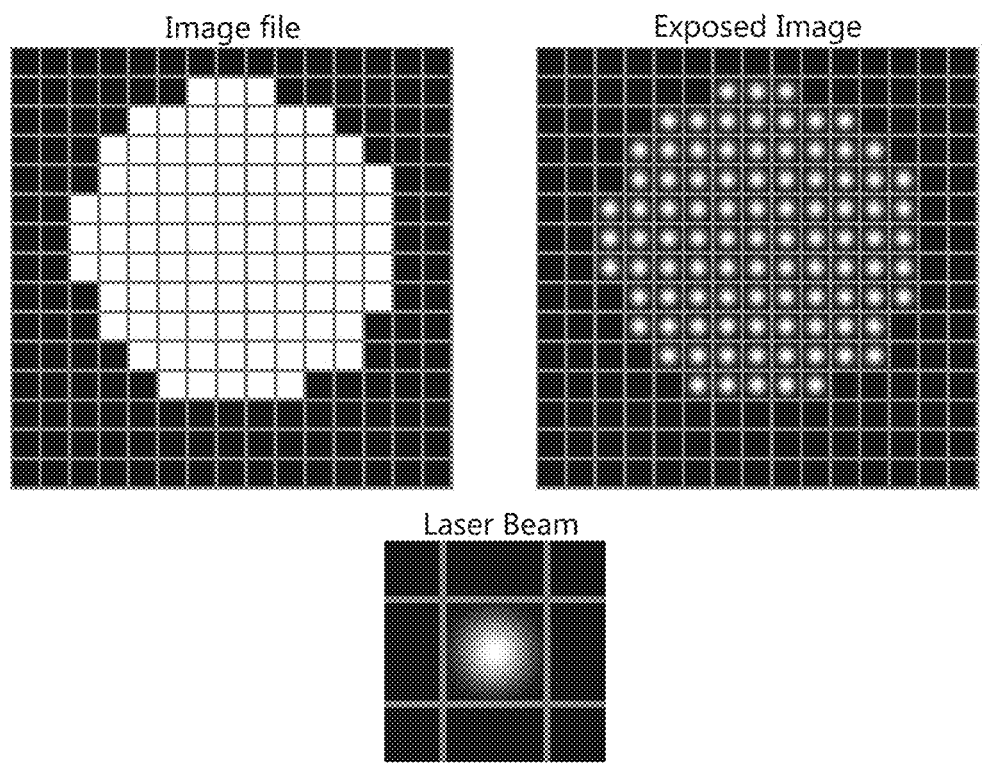
Fig. 5B (Example #2)
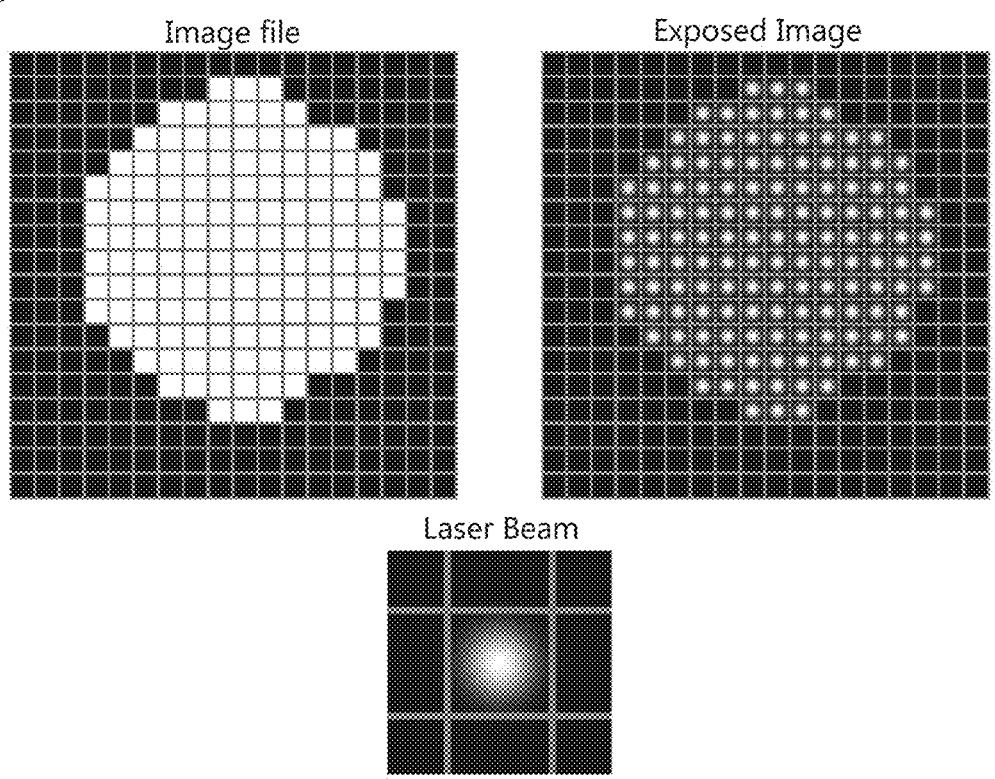

Fig. 6A (Example #1)
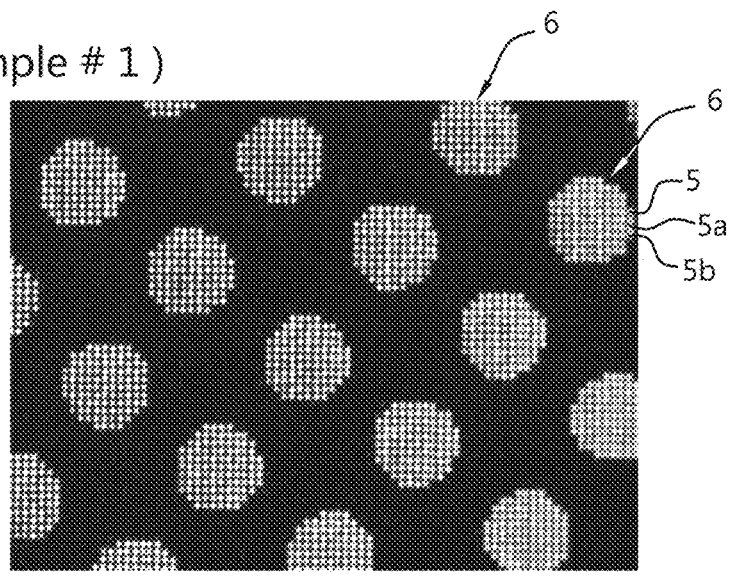
Fig. 6B (Example #1)
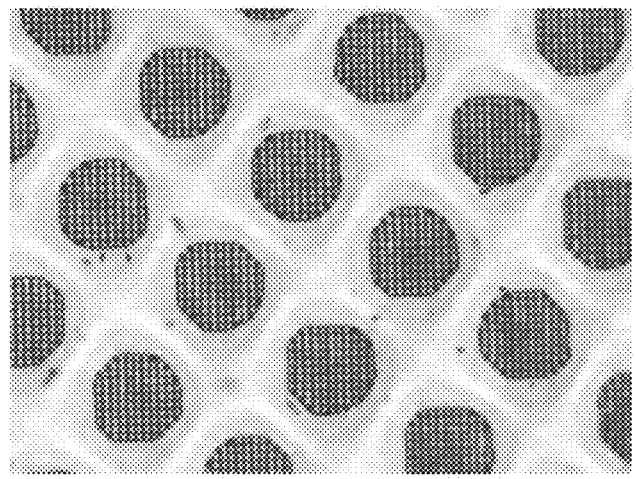
Fig. 6C (Example #1)
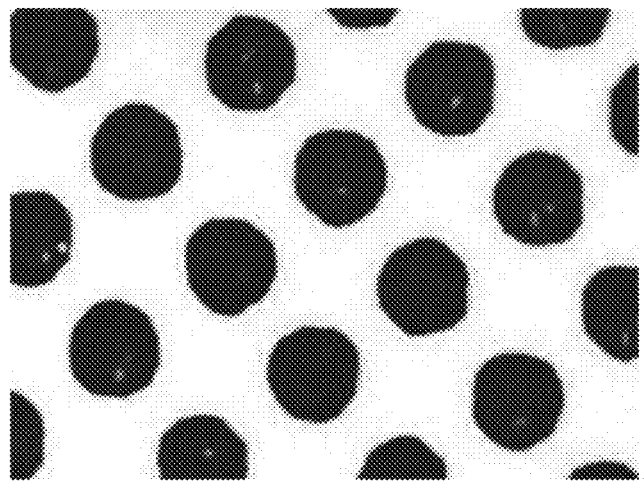

Fig. 7A
(Reference # 1)
Fig. 7B
(Example # 2)
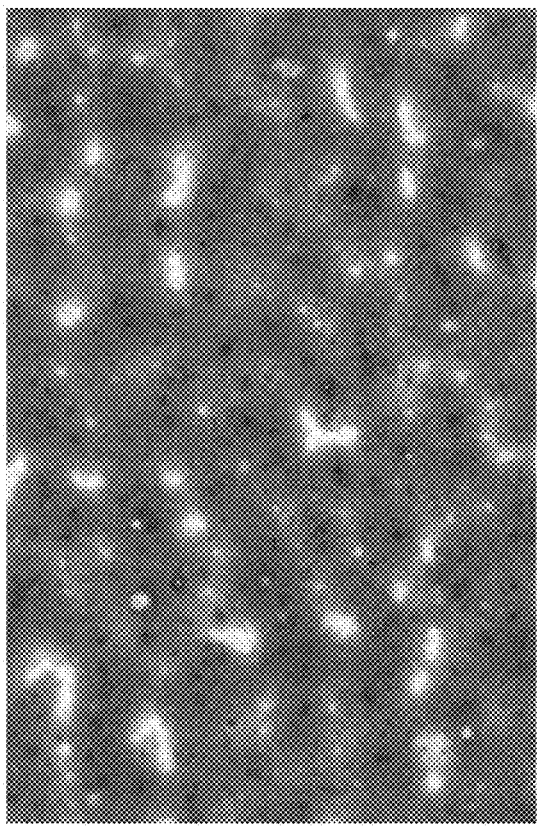

METHOD AND SYSTEM FOR APPLYING A PATTERN ON A MASK LAYER

This is a national stage application filed under 35 U.S.C. § 371 of pending international application PCT/EP2020/057645, filed Mar. 19, 2020, which claims priority to Netherlands Patent Application No. NL 2022776, filed Mar. 20, 2019, the entirety of which applications are hereby incorporated by reference herein.

FIELD OF INVENTION

The field of the invention relates to methods and systems for applying a pattern on a mask layer, in particular a mask layer used for making relief precursors, and more in particular flexographic printing plate precursors. The invention also relates to the obtained masks and the obtained relief precursor.

BACKGROUND

Flexographic printing or letterpress printing are techniques which are commonly used for high volume printing. Flexographic or letterpress printing plate are relief plates with image elements protruding above non-image elements in order to generate an image on a recording medium such as paper, cardboard, films, foils, laminates, etc. Also, cylindrically shaped printing plates or sleeves may be used.

Various methods exist for making flexographic printing plate precursors. According to conventional methods flexographic printing plate precursors are made from multilayer substrates comprising a backing layer and one or more photocurable layers. Those photocurable layers are imaged by exposure to electromagnetic radiation through a mask layer containing the image information or by direct and selective exposure to light e.g. by scanning of the plate to transfer the image information in order to obtain a relief plate.

In flexographic printing, ink is transferred from a flexographic plate to a print medium. More in particular, the ink is transferred on the relief parts of the plate, and not on the non-relief parts. During printing, the ink on the relief parts is transferred to the print medium. Greyscale images are typically created using half-toning, e.g. using a screening pattern. By greyscale is meant, for a plate printing in a particular color, the amount of that color being reproduced. For example, a printing plate may comprise different halftone dot regions to print with different densities in those regions. In order to increase the amount of ink transferred and to increase the so called ink density on the substrate, an additional very fine structure is applied to the surface of the printing areas, i.e. the relief areas. This surface screening is typically obtained by adding the fine structure to the image file and then transferred to the corresponding mask used for exposure.

An example of an existing method for making a relief plate is illustrated in FIGS. 1A-1E. FIG. 1A shows the content of an image file having an image file resolution corresponding with a pixel size p of e.g. 6.35 micrometer. The illustrated image file has square-shaped pixels 4, and contains a substantially round image region 1 to be printed. The image file resolution may be e.g. 4000 dpi (=25400*1/p (in micrometer)). Next, the image file is manipulated using a surface screen pattern which is illustrated in FIG. 1B. The surface screen pattern is applied in the image region 1 resulting in a modified image file which is shown in FIG. 1C. As shown in FIG. 1C, the resulting image region 1' contains fewer pixels 4' to be printed, and the pixels 4' to be printed are located at a distance d of each other.

Based on the modified image file of FIG. 1C, a mask is prepared. More in particular, for every pixel 4' to be printed, a hole or a transparent region 5 is arranged in the mask. This may be done using a beam of electromagnetic radiation. As shown in FIG. 1D, such a beam will generate a hole 2, here a round hole 2, which is slightly larger than the size of a pixel 4'. The resulting image on the mask is shown in FIG. 1E. The screen pattern resolution defined as the number of screen elements (pixels 4' corresponding with holes 5 in the mask) per inch, counted along a line where the distance between the closest screen elements is minimal, may be e.g. 1414 lpi (=1/(2*√2)*4000) for the example of FIG. 1E. This is illustrated in FIG. 1C which shows that the closest distance has a value d (in micron), wherein the screen pattern resolution in lpi equals the inverse of d (in micron), multiplied by 25400.

Thus, according to the method illustrated in FIGS. 1A-1E, the surface screening is computed by changing the original image file, e.g. a tiff file using software, typically a raster image processing technique, wherein typically due to the manipulation a file having a larger size is generated.

An example of such a method in disclosed in WO 2017/203034 A1. WO 2017/203034 A1 discloses a process for creating a flexographic plate or a mask for producing a flexographic plate. The process comprises providing a screen having a resolution defined by a base pattern (typically a high resolution base pattern, cf. FIGS. 1A-E) of equally sized screen spots, each screen spot comprising a smallest exposed discrete element represented on the screen. Preferably each screen spot in the base pattern comprises an isolated pixel comprising an exposed pixel surrounded by eight unexposed pixels. The plate or the mask is created by, in at least a portion of the plate or mask corresponding to a non-solid tonal area of the plate, selectively modulating the size of physical spots on the plate or the mask corresponding to the screening spots such that each set of four neighboring physical spots in the base pattern has an unexposed area centered there between. This is preferably done by imaging the mask with a laser beam, wherein the power of the laser beam is boosted for imaging each isolated pixel relative to the laser beam used for non-isolated pixels. It is further mentioned that a desirable ink transfer characteristics may be created using any system tunable to selectively modulate the size of physical spots on the plate or the mask corresponding to the screening spots such that each set of four neighboring physical spots in the base pattern has an unexposed area centered there between.

SUMMARY

The object of embodiments of the invention is to provide a method and a system for applying a pattern on a mask layer which is faster, which reduces or eliminates the need for manipulating the image file, and which allows an improved printing of solid and halftone regions of an image file.

According to a first aspect of the invention there is provided a method for applying a pattern on a mask layer. The method comprises the steps of obtaining an image file representing pixels with a first pixel size in a first direction and a second pixel size in a second direction, wherein the first and second pixel size are the same or different, and treating the mask layer such that a plurality of areas with altered physical properties are created in the mask layer, said plurality of areas corresponding to a plurality of pixels of the image file. The treatment is done such that a first and/or second area size of an area of said plurality of areas, as measured in said first and/or second direction, is smaller than the first and/or second pixel size, respectively. Preferably, the area size is measured as the longest distance between two points in a transmitted intensity profile where the transmitted intensity equals 50% of the maximum transmitted intensity.

Compared to prior art solutions, instead of treating the mask layer such that a treated area corresponding with a pixel is larger than the pixel size (cf. FIG. 1D discussed in the background section above), according to embodiments of the invention, the treated area has a first and/or second area size which is smaller than the first and/or second pixel size, respectively. In that manner, there can be created a surface screen pattern on the mask without having to manipulate the image file. It is noted that the image file may still be manipulated for other reasons, but this is not required for obtaining a surface screen pattern on the mask. Since the image file does not have to be manipulated, or is only manipulated to a limited extent, the image file to be used will be smaller compared to modified prior art image files, resulting in a faster data transmission. Also, by making a first and/or second area size of the treated area smaller than the first and/or second pixel size, respectively, a finer gradation of the surface screening pattern becomes possible.

In WO 2017/203034 A, contrary to the first aspect, a screen having a high resolution defined by a base pattern is used to manipulate the image file.

It is noted that embodiments of the invention may also be useful when no surface screening is required. Indeed, by having treated areas which are smaller than the treated areas of the prior art, the treatment can be faster since less material needs to be treated. Also, less power will be needed for the treatment.

Preferably, the treatment is done such that an area size of an area of said plurality of areas, seen in said first and said second direction, is smaller than the first and second pixel size, respectively. The first direction is preferably perpendicular to the second direction. Preferably, the first direction extends parallel to a first side of a pixel, and the second direction extends parallel to a second side of the pixel perpendicular on the first side. More preferably, a surface area of an area of said plurality of areas, as measured in a top surface of the mask layer, is smaller than a surface area of a pixel.

According to a second aspect of the invention, there is provided a method for applying a pattern on a mask layer. The method comprises the steps of obtaining an image file representing pixels with a first pixel size in a first direction and a second pixel size in a second direction, wherein the first and second pixel size are the same or different; and treating the mask layer such that a plurality of areas with altered physical properties are created in the mask layer. The plurality of areas comprises at least a first and a second area corresponding to directly adjacent first and second pixels of the image file. The treatment is done such that the first and second areas do not overlap in the first direction and/or in the second direction.

In WO 2017/203034 A, contrary to the second aspect, the screen uses isolated pixels and there are no directly adjacent pixels which have corresponding treated areas (i.e. exposed areas/physical dots) with sizes as defined above.

The expression "directly adjacent first and second pixels" implies that the distance between the first and the second pixel is equal to the first pixel size in the first direction or to the second pixel size in the second direction. The technical advantages mentioned above for the first aspect, also apply for the second aspect. Because adjacent areas corresponding with adjacent pixels do not overlap in the first and/or the second area, it becomes possible to realize a surface screen pattern on the mask without the need for manipulating the image file. It is noted that, because the first and second area do not overlap in at least one of the first and the second direction, there is untreated mask material between the first and second area. Thus, a surface screen pattern can be obtained.

Preferably, the treatment is done such that the first and second areas do not overlap in the first direction and in the second direction, and more preferably such that they do not overlap in any direction. The first direction is preferably perpendicular to the second direction. Preferably, the first direction extends parallel to a first side of a pixel, and the second direction extends parallel to a second side of the pixel perpendicular on the first side.

According to a preferred embodiment, the plurality of treated areas corresponds to a plurality of holes, or to a plurality of areas with a transparency which is different from the transparency of the untreated mask material. In other words, the treatment of the mask layer may consist of a removal of mask layer material in order to generate holes, or may consist of a treatment of the mask layer which increases the transparency thereof in the plurality of areas. Such a treatment may be for example a discoloration or bleaching of a dye, a color change, a change in refractive index, a change in polarization or combinations thereof.

According to a preferred embodiment, the first and/or second area size is in the range of 20% to 99%, more preferably in the range of 30% to 90%, even more preferably in the range of 40% to 80%, of the first and/or second pixel size, respectively. Such first and/or second area sizes will allow generating a suitable surface pattern screen, without the need for manipulating the image file.

According to a preferred embodiment, the step of treating the mask layer is done using a beam of a first electromagnetic radiation. The wavelength of the first electromagnetic radiation may be in the range of 200 to 2000 nm, preferably in the range of 200 to 400 nm or 800 to 1500 nm.

Preferably, the beam has a first and/or second beam size, as measured in the first and second direction, which is smaller than the first and/or second pixel size, respectively. Preferably, the first and second beam size is measured as the longest distance in an intensity profile, of a cross section of the beam in said first and second direction, respectively, between two points in the intensity profile where the intensity equals 50% of the maximum intensity of this cross section. Such a first and/or second beam size will allow obtaining a first and/or second area size which is smaller than the first and/or second pixel size. For example, the first and/or second beam size may be in the range of 20% to 95%, preferably in the range of 40% to 80%, of the first and/or second pixel size. It is noted that the first and second beam size is not the only parameter of the beam which will influence the first and second area size. Also, a wavelength of the beam, the beam power, and the on-time of the beam may influence the first and second area size. However, typically, the first and second beam size will be the main parameter influencing the first and second area size.

According to an exemplary embodiment, the beam is chosen to have a wavelength, a first and second beam size, a beam power and an on-time, wherein the wavelength and/or the beam power and/or the first and/or second beam size and/or the on-time is set based on an analysis of the obtained image file. For example, the first and/or second beam size may be adjusted based on information in the image file. For example, when a greyscale image region, i.e. a halftone region needs to be printed, the first and/or second beam size may be adjusted in function of the grey value (also called the tonal value) of the image region.

In an exemplary embodiment, a beam used for generating areas corresponding with pixels of a first region of the image file may be different from a beam used for generating areas corresponding with pixels of a second region of the image file. For example, the first region may be a greyscale region with a first grey value, and the second region may be a solid region. In such an example, the beam set for the first region may have a smaller first and/or second beam size than the beam set for the second region. It is noted that the first and/or second beam size for the solid region and/or for certain greyscale regions may also be equal to or larger than the first and/or second pixel size, respectively.

In further developed embodiments a beam, and in particular the first and/or second beam size and/or the beam power thereof, may be chosen in function of a tonal value of pixels of a half-tone region of the image file. Preferably the beam is chosen, such that a smaller first and/or second area size is generated for a lower tonal value than for a higher tonal value. In the context of the present application, the term "greyscale region" is used as a synonym of the term "half-tone region". Similarly, the term "tonal value" is used as a synonym for the term "grey value".

The cross section of the beam may have a circular, elliptic, square, rectangular or polygonal shape. When the beam size is circular or square, the first and the second beam size are the same. When the beam shape is elliptic or rectangular, the first and the second beam size are different. Also, the intensity profile of the beam may be Gaussian, trapezoidal or rectangular. Preferably, the beam is set such that the center of the beam is located close to or at the center of a corresponding pixel.

In yet further developed embodiments, also the shape of the beam and/or the intensity profile of the beam may be varied in function of the content of the image file.

According to an exemplary embodiment, the mask layer is initially essentially in-transparent for the first electromagnetic radiation of the beam. Preferably, the mask layer absorbs more than 80% of the first electromagnetic radiation of the beam. Preferably, the mask layer is undergoing a change in transparency due to ablation, bleaching, color change and/or polarization change when exposed to the first electromagnetic radiation. In the most preferred embodiment, the mask layer is ablatable by the first electromagnetic radiation, such that holes are created in the mask layer. In the latter embodiment, the treated areas correspond with holes.

In a further developed embodiment, the step of treating the mask layer may be controlled such that, for an image region of the image included in the image file, the plurality of areas corresponding to the at least one image region form a pattern. Preferably, the pattern is any one of the following: a regular or a periodic pattern, a stochastic pattern. For example, the image region may be a half-tone region, and the pattern may be a checkered pattern, a line pattern (wherein the lines are formed of non-overlapping adjacent treated areas), etc. Also, the pattern may be chosen in function of the type of image region. For example, the pattern may be different for a half-tone region as compared to the pattern of a solid region. It is noted that instead of controlling the treating of the mask layer, it is also possible to manipulate the image file. In other words, the pattern may be introduced either in the hardware and/or in the software.

It is noted that when having a mask region (e.g. corresponding with a halftone region) with treated areas which have a first and/or second area size which is smaller than the first and/or second pixel size, respectively, it is possible to obtain a surface screening effect without removing pixels. However, in addition to using a smaller first and/or second pixel size, it is also possible to "remove" pixels to decrease the density of the treated areas in the mask region. This can be done either in the software or by suitably controlling the treatment, e.g. by switching on and off the laser beam according to the desired pattern that one wishes to achieve.

In addition or alternatively, the step of treating the mask layer is controlled and/or the image file is manipulated, such that, for an image region of the image included in the image file, the first and/or second area size and/or the distribution of the areas is the same or different in an area close to the center and an area close to the edge of the image region. For example, the first and/or second area size in the center may be smaller than the first and/or second pixel size, respectively, whilst the area size close to the edge of the image region may be equal or larger than the first and/or second pixel size. In that manner, it becomes possible to create a closed edge of the image region. The size may be changed step-wise or continuously. This may be advantageous to maintain the ink on the relief area corresponding with the image region.

In addition or alternatively, the step of treating the mask layer may be controlled and/or the image file may be manipulated, such that:
for an image region of the image included in the image file, the density of the areas is set in function of the surface area of the image region; and/or
for an image region of the image included in the image file, the density of the areas is increasing or decreasing from the center of the image region to the edge of the image region.

In other words, the surface pattern resolution may be varied in function of the surface area of the image region. For example, for an image region with a relatively high tonal value, the density of the areas may be higher than for an image region with a relatively low tonal value.

In the examples mentioned above, the image region may correspond to a half-tone region or to a solid region.

Preferably, the pixels of the image file are square or rectangular. If the pixels are square the first pixel size is equal to the second pixel size. If the pixels are rectangular, the first pixel size may correspond with the smallest of the width and length of the rectangular pixel, and the second pixel size may correspond with the largest of the width and the length or vice versa. Preferably, the first and the second pixel size is in the range of 80 μm to 1 μm, preferably from 25 μm to 2 μm, and more preferably from 25 μm to 5 μm. The image file resolution is the number of pixels per inch, counted along a line where the distances between the closest pixels is minimal. Thus, when a pixel is rectangular with a first pixel size and a second pixel size larger than the first pixel size, the image file resolution is calculated using the first pixel size. Stated differently, preferably, the image file resolution is in the range from 300 to 20000 dpi, preferably 1000 to 10000 dpi, more preferably from 1000 to 5500 dpi.

The mask layer may be comprised in a printing plate precursor. More in particular, the mask layer may be provided as an outer layer of the printing plate precursor, but the mask layer may also be provided as an intermediate layer within the printing plate precursor. The printing plate precursor may comprise one or more layers, preferably one or more of the following layers: a support layer, a photoactive layer, a protective layer, a barrier layer, a diffracting layer, a diffusing layer, an adhesive layer or combinations thereof.

According to a further aspect of the invention, there is provided a method to form an imaged layer composition. The method comprises the steps of combining a mask layer and a substrate layer to form a layer composition, and applying a pattern to the mask layer according to any one of the embodiments of the method disclosed above. The method comprises the further step of treating the layer composition such that the substrate layer undergoes a property change in a plurality of substrate areas corresponding with the plurality of areas created in the pattern mask layer, such that an imaged layer composition is formed.

The step of treating the layer composition may be done with a second electromagnetic radiation. The wavelength of the second electromagnetic radiation may be in the range of 200 nm to 2000 nm, preferably 200 nm to 400 nm.

The method may further comprise at least one step of treating the layer composition to make use of the property change in order to obtain a further treated layer composition. For example, non-treated parts of the substrate layer may be removed in order to generate a relief.

The step of applying a pattern to the mask layer may be done after or before the step of combining the mask layer and the substrate layer. In other words, the mask layer may be first patterned before attaching it to the substrate layer, or it may be patterned whilst attached to the substrate layer. The combining of the mask layer and the substrate layer may comprise attaching a mask layer to the substrate layer, or making the mask layer and substrate layer as integral layers of a substrate.

The substrate layer may comprise a support layer, a photoactive layer, a protective layer, an adhesive layer, a barrier layer, a slip layer, a roughened layer, a layer that changes the polarization of electromagnetic waves, or combinations thereof.

The property change caused by the treatment of the layer composition may be achieved by a solidification, a change in solubility, a change in color, a change in refractive index, a change in transmission, a change in polarization, or a combination thereof. The change in solubility may be achieved by polymerization, crosslinking, de-polymerization, cleavage of polymeric chains, cleavage of protecting groups, or combinations thereof. Preferably, the change in solubility is achieved by polymerization and/or crosslinking, most preferably by radical polymerization and/or crosslinking.

Using such methods, the resulting imaged layer composition may form a relief precursor. For example, the treated areas of the substrate layer may correspond with relief areas of the relief precursor. More in particular, the further treated layer composition may be a printing plate such as an offset plate, a flexographic plate, a letterpress plate, a tampon printing plate, or an intaglio plate.

According to another aspect of the invention, there is provided a mask with a mask layer provided with a pattern which has been applied according the method of any one of the embodiments disclosed above.

The invention further relates to a combination or assembly of a mask and a computer storage medium. The computer-readable storage medium stores an image file having representing pixels with a first pixel size in a first direction and a second pixel size in a second direction, wherein the first and second pixel size are the same or different. The mask comprises a mask layer with a plurality of areas with altered physical properties. The plurality of areas corresponds to a plurality of pixels of the image file. A first and/or second area size of an area of said plurality of areas, as measured in the first and/or second direction, is smaller than the first and/or second pixel size, respectively. The first and second area size may be measured as described above. In addition or alternatively, the plurality of areas comprises at least a first and a second area corresponding with adjacent first and second pixels of the image file, wherein the first and second area do not overlap in the first and/or second direction.

The technical advantages set out above for the method, apply mutatis mutandis for the combination or assembly of a mask and computer-readable storage medium.

The invention further relates to a relief precursor comprising an imaged layer composition obtained according to any one of the embodiments of the method for forming an imaged layer composition disclosed above.

According to another aspect of the invention, there is provided an assembly or a combination of a relief precursor and a computer-readable storage medium storing an image file representing pixels with a first pixel size in a first direction and a second pixel size in a second direction, wherein the first and second pixel size are the same or different. The relief precursor comprises a substrate layer with a plurality of relief areas, said plurality of relief areas corresponding to a plurality of pixels of the image file. A first and/or second relief area size of a relief area of said plurality of relief areas, as measured in the first and/or second direction, is smaller than the first and/or second pixel size, respectively. The first and second relief area size may be measured at a top surface of the relief areas. In addition or alternatively, the plurality of relief areas comprises at least a first and a second relief area corresponding with directly adjacent first and second pixels of the image file. The first and second relief areas do not overlap in the first and/or second direction.

Also, the invention relates to the use of such a relief precursor for printing an image included in an image file representing pixels with a first pixel size in a first direction and a second pixel size in a second direction, wherein the first and second pixel size are the same or different.

According to yet another aspect of the invention, there is provided a system for applying a pattern on a mask layer. The system comprises a control module and a treatment means. The control module is configured for obtaining an image file representing pixels with a first pixel size in a first direction and a second pixel size in a second direction, wherein the first and second pixel size are the same or different. The treatment means is configured for treating the mask layer such that a plurality of areas with altered physical properties are created in the mask layer, said plurality of areas corresponding to a plurality of pixels of the image file. The control module is further configured to control the treatment such that a first and/or second area size of an area of the plurality of areas, as measured in the first and/or second direction, is smaller than the first and/or second pixel size. Additionally or alternatively, the treatment means may be configured for treating the mask layer such that a plurality of areas with altered physical properties are created in the mask layer, said plurality of areas comprising at least a first and second area corresponding with directly adjacent first and second pixels of the image file. The control module may then be configured to control the treatment means such that the first and second area do not overlap in the first and/or second direction.

The treatment means may comprise a beam generating means for generating a beam of a first electromagnetic radiation. Preferably, the beam has a first and second beam size. The first and/or second beam size, as seen in the first and/or second direction, may be smaller than the first and/or second pixel size, respectively, and more preferably in the range of 20% to 95%, preferably in the range of 40% to 80%, of the pixel size.

The control module may be configured to control the beam generating means, and more in particular to control a wavelength, a first and/or second beam size, a beam power and an on-time of the beam, wherein said beam power and/or said first and/or second beam size and/or said on-time may be controlled based on an analysis of the obtained image file.

The control module may be configured to control the beam generating means in accordance with any one of the methods steps described above in connection with the method. It is further noted that the apparatus features corresponding to the method features described above may be included in the system.

BRIEF DESCRIPTION OF THE FIGURES

The accompanying drawings are used to illustrate presently preferred non-limiting exemplary embodiments of methods and systems of the present invention. The above and other advantages of the features and objects of the invention will become more apparent and the invention will be better understood from the following detailed description when read in conjunction with the accompanying drawings, in which:

FIGS. 4A and 4B illustrate two examples of the prior art, the image file, the laser beam used and the exposed image;

FIG. 4C illustrates an example of the prior art which apply surface screening in the image file, wherein each figure shows respectively an image file, the applied surface pattern, the modified image file, the laser beam used and the exposed image on the mask layer;

FIGS. 5A and 5B illustrate two exemplary embodiments of the invention, wherein each figure shows respectively the used image file, the used laser beam, and the exposed image on the mask;

FIG. 6A is a top view of an exemplary embodiment of a mask;

FIG. 6B is a top view of an exemplary embodiment of a printing plate in an inked state;

FIG. 6C is a top view of a printed medium using the printing plate of FIG. 6B;

FIGS. 7A and 7B compare a printed sample printed using a relief plate made in accordance with the prior art example of FIG. 4A, and made in accordance with the exemplary embodiment of the invention of FIG. 5B, respectively.

DETAILED DESCRIPTION OF EMBODIMENTS

Figure 1A:
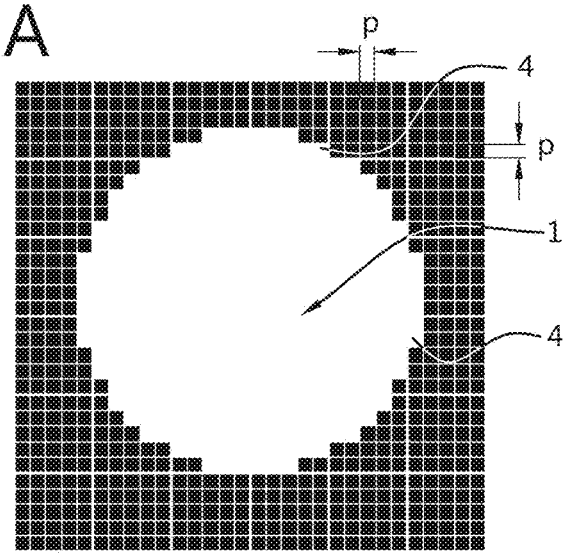
FIGS. 1A-1E illustrate schematically an embodiment of the prior art.
Figure 1B:
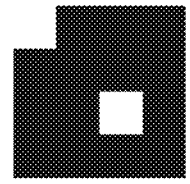
Figure 1C:
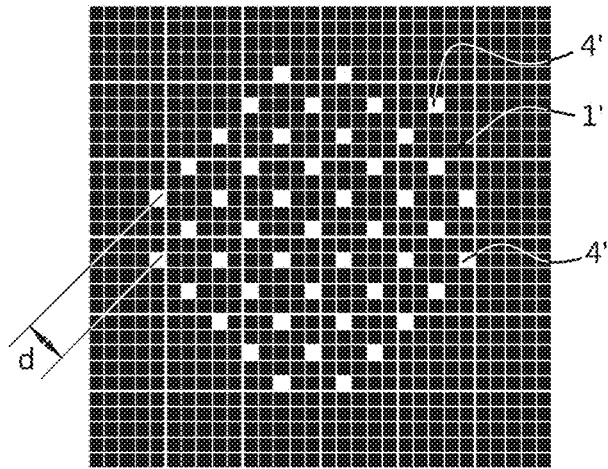
Figure 1D:
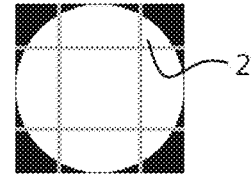
Figure 1E:
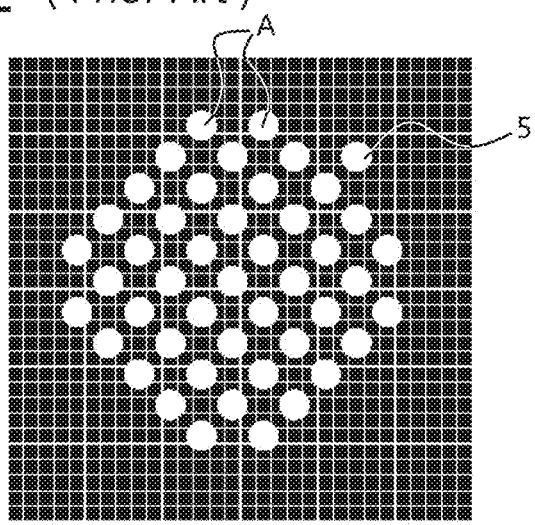
Figure 2A:
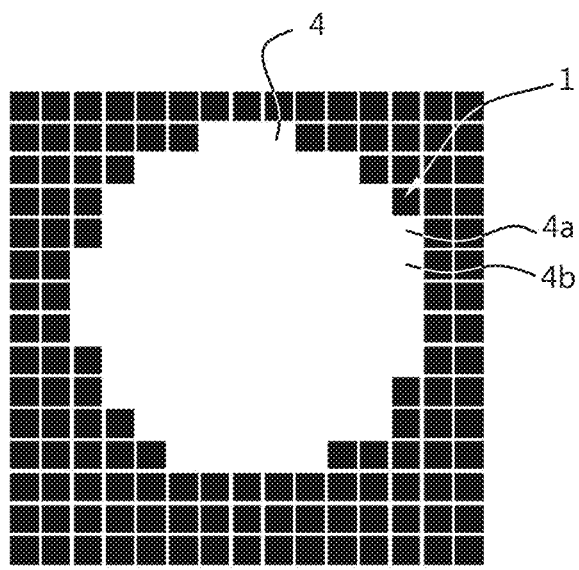
FIGS. 2A-2C illustrate an exemplary embodiment of a method according to the invention.
Figure 2B:
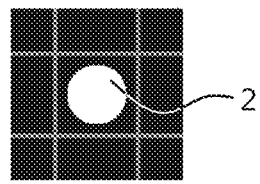
Figure 2C:
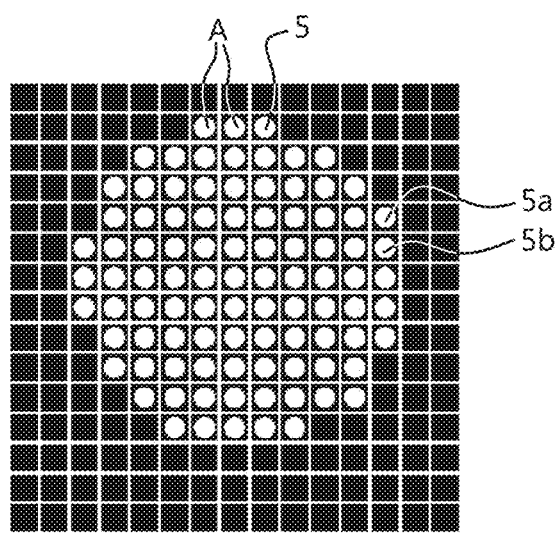
Figure 3A:
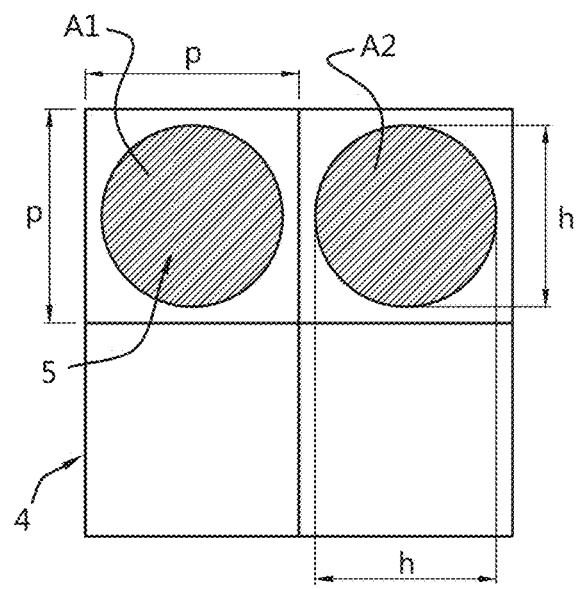
FIGS. 3A-3D illustrate four exemplary embodiments showing for each embodiment a plurality of pixels with its corresponding treated areas.

FIGS. 2A-2C and FIG. 3A illustrate an exemplary embodiment of a method according to the invention. In a first step illustrated in FIG. 2A and image file is obtained having an image file resolution corresponding to a pixel size p (see the detail shown in FIG. 3A). The illustrated image file has square-shaped pixels 4 such that the first and second pixel size seen in a first direction and in a second direction perpendicular on the first direction, are the same and are equal to p. The illustrated image file contains a substantially round image region 1 to be printed. The image file resolution corresponding with pixel size p may be e.g. 4000 dpi. Next a mask layer is treated with a beam of first electromagnetic radiation. The beam is adapted to generate a treated area A, here a hole 2. The generated hole 2 is illustrated in FIG. 2B and has an area size h which is smaller than the pixel size p, see also FIG. 3A. Using such a beam, a plurality of holes 5 are created in the mask layer, said plurality of areas corresponding to a plurality of pixels 4 of the image file. A top view of the mask layer is illustrated in FIG. 2C. FIG. 3A shows a detail with four pixels of FIG. 2C.

The beam, and in particular the beam size, is chosen such that an area size h of a hole 5 of the plurality of holes 5 is smaller than the pixel size p. The plurality of holes 5 comprises at least a first and second area A1, A2, here a first and second hole 5a, 5b corresponding to directly adjacent first and second pixels 4a, 4b of the image file, wherein the treatment by the beam is done such that the first and second hole 5a, 5b do not overlap. When referring to directly adjacent pixels, it is meant that the pixels have a common edge, i.e. either an edge in the first direction or an edge in the second direction. In other words, in the example of FIGS. 2A-2C and 3A, directly adjacent pixels have a common edge with a length which corresponds to the pixel size p.

Figure 3B:
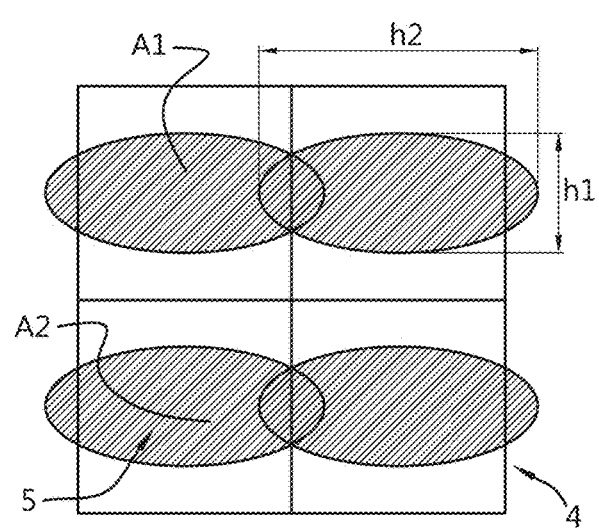
Figure 3C:
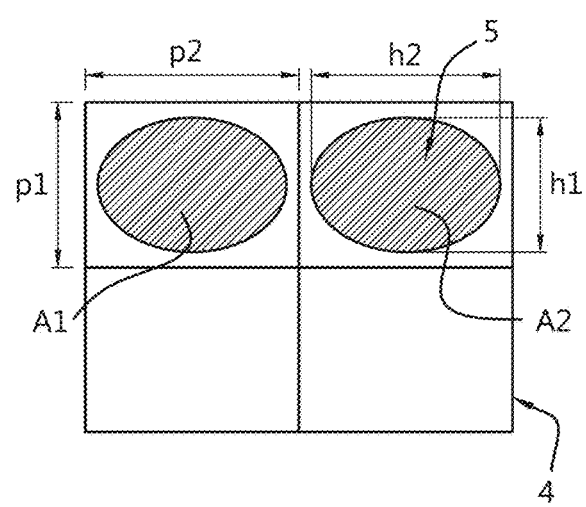
Figure 3D:
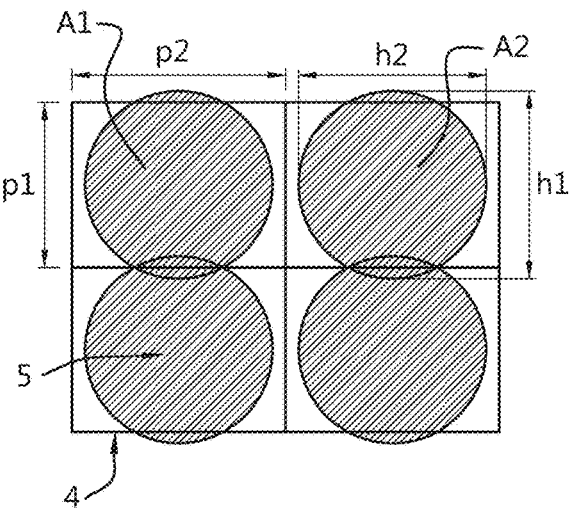

FIGS. 3B-3D illustrate other possible pixel sizes and area sizes. In the embodiment of FIG. 3B, the pixels are square sizes and have a pixel size p. The first and second area size $h1, h2$ are different. In the illustrated example the area is substantially elliptic with a first smallest area size $h1$ extending in a first direction, which is smaller than the pixel size p, and with a second larger area size $h2$ extending in a second direction perpendicular on the first direction, which is larger than the pixel size p ($h1<p, h2>p$). In that way a first plurality of areas A1 can be formed, said areas A1 overlapping in the second direction but not in the first direction, and a second plurality of areas A2 can be formed which overlap in the second direction but not in the first direction, wherein the second plurality does not overlap with the first plurality. In that way the surface screen pattern will look more or less as a line pattern.

In another non-illustrated example the area is substantially elliptic with a first smallest area size $h1$ extending in a first direction, which is smaller than the pixel size p, and with a second larger area size $h2$ extending in a second direction perpendicular on the first direction, which is also smaller than the pixel size p ($h1<p, h2<p$). In that way a plurality of areas A1, A2 can be formed which do not overlap in the first and second direction.

In the embodiment of FIG. 3C, the pixels are rectangular and have a first pixel size $p1$ in a first direction and a second pixel size $p2$ in a second direction perpendicular to the first direction. Also, the first and second areas size $h1, h2$ are different. In the illustrated example the area is substantially elliptic with a first smallest area size $h1$ extending in the first direction, which is smaller than the first pixel size $p1$, and with a second larger area size $h2$ extending in the second direction, which is smaller than the second pixel size $p2$ ($h1<p1, h2<p2$). In that way a plurality of areas A1, A2 can be formed which do not overlap in the first and second direction.

In the embodiment of FIG. 3D, the pixels are also rectangular and have a first pixel size $p1$ in a first direction and a second pixel size $p2$ in a second direction perpendicular to the first direction. The first and second areas size $h1, h2$ may be the same or different. In the illustrated example the area is substantially circular with a first area size h1 extending in the first direction, which is larger than the first pixel size p1, and with a second area size h2 extending in the second direction, which is smaller than the second pixel size p (h1>p1, h2<p2). In that way a first plurality of areas A1 can be formed which overlap in the first direction but not in the second direction, and a second plurality of areas A2 can be formed which overlap in the first direction but not in the second direction, wherein the second plurality does not overlap with the first plurality. In that way the surface screen pattern will look more or less as a line pattern.

FIGS. 4A and 4B illustrate for two examples of the prior art, the image file (on the left), the laser beam used (bottom image) and the exposed image (on the right). No surface screening is applied. In the exposed image adjacent areas overlap as the beam size used is larger than the pixel size. FIG. 4C illustrates another example of the prior art which applies surface screening in the image file, wherein the figure shows respectively an image file (top left), the applied surface pattern (bottom left), the modified image file (top middle), the laser beam used (bottom right) and the exposed image on the mask layer (top right). In the exposed image of FIG. 4C, adjacent areas corresponding with directly adjacent pixels would overlap as the beam size used is larger than the pixel size, but because surface screening is performed in the image file, there are no adjacent areas corresponding with directly adjacent pixels.

FIGS. 5A and 5B illustrate two exemplary embodiments of the invention, wherein each figure shows respectively the used image file (top left), the used laser beam (bottom), and the exposed image on the mask (top right). The pixels have a square shape with a pixel size which is the same in a first and second direction, as described above in connection with FIGS. 2A-2C and FIG. 3A. The used beam is circular and has a beam size which is smaller than the pixel size, and no surface screening is done in the image file.

FIG. 6A is a top view of an exemplary embodiment of a mask with a plurality of mask regions 6 corresponding with a plurality of halftone image regions. Each mask region 6 comprises a plurality of holes 5. In the example, the mask region comprises adjacent holes 5a, 5b corresponding with directly adjacent pixels. FIG. 6B is a top view of an exemplary embodiment of a printing plate made using the mask of FIG. 6A, in an inked state. FIG. 6C is a top view of a printed medium using the printing plate of FIG. 6B.

FIGS. 7A and 7B compare a printed sample printed using a relief plate made in accordance with the prior art example of FIG. 4A, and made in accordance with the exemplary embodiment of the invention of FIG. 5B, respectively. It can be seen that the result obtained with the embodiment of the invention is significantly better compared to the result obtained according to the prior art example.

EXAMPLES

In table 1 three examples of the prior art (Ref. 1 to Ref. 3) are compared with two examples (Ex. 1 to Ex. 2) of the present invention.

Different methods and beam sizes were applied to a digital printing plate precursor comprising an integrated mask layer, which may be ablated by an IR Laser beam. Table 1 contains the specific dimensions, beam shapes and intensity profiles, as well as the results obtained upon printing (solid ink density).

TABLE 1

| Sample | Image File resolution (dpi) | Pixel size (μm) | Surface Pattern Resolution (lpi) | Beam Diameter (μm) | Beam Shape | Intensity profile | Relative Laser Beam Diameter (% of pixel size) | Number of tonal values @150 lpi classic screen ruling | Relative file size in % (typical file) | File size after surface screening | Surface screening computation time | Size of hole in mask (μm) | Relative size of hole in the mask (% of pixel size) | Solid Ink density |
|---|---|---|---|---|---|---|---|---|---|---|---|---|---|---|
| Ref. 1 Fig. 4A | 2540 | 10 | none | 11 | Round | Gauss | 110 | 286 | ~120 | equal | none | 12.5 | 125 | low |
| Ref. 2 Fig. 4B | 4000 | 6.35 | none | 7 | Round | Gauss | 110 | 711 | ~220 | equal | none | 8 | 125 | low |
| Ref. 3 Fig. 4C | 4000 | 6.35 | 1414 | 7 | Round | Gauss | 110 | 89 | ~250 | larger | extra | 12.7 | 200 | high |
| Ex. 1 Fig. 5A | 2000 | 12.7 | 2000 | 6 | Round | Gauss | 47 | 177 | ~100 | equal | none | 6 | 47 | high |
| Ex. 2 Fig. 5B | 2540 | 10 | 2540 | 6 | Round | Gauss | 60 | 286 | ~120 | equal | none | 6 | 60 | high |

The image file resolution (dpi) is the number of pixels per inch, counted in one dimension and expressed in dpi (dots per inch) or ppi (pixels per inch), in the image file. For the examples of the table the pixels are square. The pixel size, in micron and in that dimension, is the inverse of the resolution in dpi, multiplied by 25400.

The beam diameter (micron) is the longest measured distance in the intensity profile, of any cross section of the beam, between two points in the intensity profile where the intensity equals 50% of the maximum intensity in this section. The intensity profile is the intensity profile of light as generated by a single imaging pixel.

The intensity profile is the spatial distribution of the light intensity (W/mm2) of the laser beam. Typical profiles can be merely Gaussian, merely rectangular (top hat) or merely trapezoidal. The intensity profile is the intensity profile of light as generated by a single imaging pixel.

The beam shape is the 2-D shape of a cross section of the intensity profile at a specific intensity value. Typical beam shapes are elliptical or round, or are polygonal (square, rectangular, triangular, hexagonal, . . . ). The intensity profile is the intensity profile of light as generated by a single imaging pixel.

The number of tonal values in a classic screen with additional surface screening is the number of surface pattern elements in a full tone classic screen element. It is equal to the square of the ratio between the surface screen lpi and the classic screen lpi.

The size of the hole in the mask in micron is the size of the hole in the mask, created by the intensity profile of the exposing light, generated by a single imaging pixel. It is analyzed with a transmitted light microscope and uses the transmitted light intensity profile. It is measured as the longest distance in the transmitted intensity profile between two points in the transmitted intensity profile where the transmitted intensity equals 50% of the maximum transmitted intensity.

The solid ink density is measured on a printed sample of a solid area, as the reflected density using a digital densitometer.

The results for examples 1 and 2 in table 1 clearly show that a high ink density was obtained in a shorter time and without manipulation of the image file.

The table above shows that the surface pattern screening resolution that can be obtained with the embodiments of FIGS. 5A and 5B is higher than the surface pattern screening resolution that can be obtained with embodiments of the prior art (FIGS. 4A-4C) whilst the file size can remain small.

Whilst the principles of the invention have been set out above in connection with specific embodiments, it is to be understood that this description is merely made by way of example and not as a limitation of the scope of protection which is determined by the appended claims.

The invention claimed is:

1. A method for applying a pattern on a mask layer for a printing plate precursor, said method comprising:
    obtaining an image file without a screen pattern, said image file representing pixels with a first pixel size in a first direction parallel to an edge of the pixel, and a second pixel size in a second direction perpendicular to the first direction, wherein the first and second pixel size are the same or different; and
    treating the mask layer such that a plurality of areas with altered physical properties are created in the mask layer, said plurality of areas corresponding to a plurality of pixels of said image file without a screen pattern, wherein the treatment is done such that a first and/or a second area size of an area of said plurality of areas, seen in said first and/or said second direction, is smaller than the first and/or second pixel size, respectively;
    wherein the method is performed without manipulating said image file without a screen pattern for obtaining a surface screen pattern on the mask;
    wherein the method comprises a step of combining the mask layer and a substrate layer, the substrate layer comprising a support layer and a photoactive layer, before or after the step of treating the mask layer so as to obtain a printing plate precursor.

2. The method of claim 1, wherein the treatment is done such that an area size of an area of said plurality of areas, seen in said first and said second direction, is smaller than the first and second pixel size, respectively.

3. The method according to claim 1, wherein the plurality of areas correspond to a plurality of holes or to a plurality of areas with a transparency to electromagnetic radiation which is different from the transparency of the untreated mask material.

4. The method according to claim 1, wherein the first and/or second area size is in the range of 20% to 99% of the first and/or second pixel size, respectively.

5. The method according to claim 1, where the step of treating the mask layer is done using a beam of a first electromagnetic radiation.

6. The method according to claim 5, wherein the beam has a first and second beam size in said first and second direction, wherein said first and/or second beam size is smaller than the first and/or second pixel size, respectively, said first and second beam size being the longest distance in an intensity profile, of a cross section of the beam in said first and second direction, respectively, between two points in the intensity profile where the intensity equals 50% of the maximum intensity in this cross section.

7. The method according to claim 6, wherein the first and/or second beam size is in the range of 20% to 95%, respectively.

8. The method according to claim 5, wherein the beam is chosen to have a wavelength, a first and second beam size, a beam power and an on-time, wherein said beam power and/or said first and/or second beam size and/or said on-time is set for all imaging pixels of the image file based on an analysis of the obtained image file.

9. The method according to claim 5, wherein a beam used for generating areas corresponding with pixels of a first region of the image file is different from a beam used for generating areas corresponding with pixels of a second region of the image file.

10. The method according to claim 5, wherein the beam is chosen to have a wavelength, a first and second beam size, a beam power and an on-time, and wherein said beam power and/or said first and/or second beam size and/or said on-time, is chosen in function of a tonal value of pixels of a halftone region of the image file.

11. The method according to claim 5, wherein the cross section of the beam has a circular, elliptic, square, rectangular or polygonal shape, and/or wherein the intensity profile of the beam is Gaussian, trapezoidal or rectangular.

12. The method according to claim 5, wherein the mask layer initially is essentially in-transparent for first the electromagnetic radiation of the beam; and/or wherein the mask layer is undergoing a change in transparency due to ablation, and/or bleaching, and/or color change, and/or polarization change when exposed to the first electromagnetic radiation.

13. The method according to claim 1, wherein the step of treating the mask layer is controlled, such that, for an image region of the image included in the image file, the plurality of areas corresponding to the at least one image region form a pattern; wherein the image region corresponds to a halftone region or a solid region.

14. The method according to claim 13, wherein the step of treating the mask layer is controlled, such that, for an image region of the image included in the image file, the first and/or second area size and/or the distribution of the areas is the same or different in an area close to the center and an area close to the edge of the image region.

15. The method according to claim 1, wherein the step of treating the mask layer is controlled, such that, for an image region of the image included in the image file, the density of the areas is set in function of the size of the image region and/or the density of the areas increases or decreases from the center of the image region to the edge of the image region.

16. The method according to claim 1, wherein the obtained image file has not been manipulated by changing the image file resolution and/or has not been manipulated by removing pixels to generate said plurality of areas within the image file.

17. The method according to claim 1, wherein the printing plate precursor comprises one or more layers selected from the list consisting of a protective layer, a barrier layer, a diffracting layer, a diffusing layer, an adhesive layer, or combinations thereof.

18. A method to form an imaged layer composition, said method comprising the steps:

combining a mask layer and a substrate layer to form a layer composition, applying a pattern to the mask layer according to the method of claim 1, exposing the layer composition through the mask layer such that the substrate layer undergoes a property change in a plurality of substrate areas corresponding with the plurality of areas created in the patterned mask layer, such that an imaged layer composition is formed.

19. The method according to claim 18, wherein the step of treating the layer composition is done with a second electromagnetic radiation.

20. The method of claim 1, wherein the image file comprises at least one halftone region.

21. A method for applying a pattern on a mask layer for a printing plate precursor, said method comprising:

obtaining an image file without a screen pattern, said image file representing pixels with a first pixel size in a first direction parallel to an edge of the pixel, and a second pixel size in a second direction perpendicular to the first direction, wherein the first and second pixel size are the same or different; and treating the mask layer such that a plurality of areas with altered physical properties are created in the mask layer, said plurality of areas comprising at least a first and second area corresponding to directly adjacent first and second pixels of said image file without a screen pattern, wherein the treatment is done such that the first and second area do not overlap in the first direction and/or in the second direction;

wherein the method comprises a step of combining the mask layer and a substrate layer, the substrate layer comprising a support layer and a photoactive layer, before or after the step of treating the mask layer so as to obtain a printing plate precursor.

22. A system configured for applying a pattern on a mask layer of a printing plate precursor, the printing plate precursor further comprising a substrate layer comprising a support layer and a photoactive layer, said system comprising:

a control module configured for obtaining an image file without a screen pattern, said image file representing pixels with a first pixel size in a first direction parallel to an edge of the pixel, and a second pixel size in a second direction perpendicular to the first direction, wherein the first and second pixel size are the same or different; and a first treatment means configured for treating the mask layer using a beam of a first electromagnetic radiation such that a plurality of areas with altered physical properties are created in the mask layer, said plurality of areas corresponding to a plurality of pixels of said image file without a screen pattern;

wherein said control module is further configured to control the treatment such that a first and/or second area size of an area of said plurality of areas, as measured in said first and second direction, is smaller than the first and second pixel size, respectively;

wherein the controlling is performed without manipulating said image file without a screen pattern for obtaining a surface screen pattern on the mask layer.

23. The system of claim 22, comprising a second treatment means configured for exposing the printing plate precursor through the mask layer with a second electromagnetic radiation.

24. A system configured for applying a pattern on a mask layer of a printing plate precursor, the printing plate precursor further comprising a substrate layer comprising a support layer and a photoactive layer, said system comprising:

a control module configured obtaining an image file without a screen pattern, said image file representing pixels with a first pixel size in a first direction parallel to an edge of the pixel, and a second pixel size in a second direction perpendicular to the first direction, wherein the first and second pixel size are the same or different; and a first treatment means configured for treating the mask layer using a beam of a first electromagnetic radiation such that a plurality of areas with altered physical properties are created in the mask layer, said plurality of areas comprising at least a first and second area corresponding with directly adjacent first and second pixels of said image file without a screen pattern;

wherein said control module is further configured to control the first treatment means such that the first and second area do not overlap in the first and/or second direction.

* * * * *